(12) United States Patent  (10) Patent No.: US 7,674,053 B1
Davidson et al.  (45) Date of Patent: Mar. 9, 2010

(54) DUAL KEY POD DATA ENTRY DEVICE

(76) Inventors: Lindsay A. Davidson, 137 Capuchino Dr. #7, Millbrae, CA (US) 94030; James P. Davidson, 402 Cliff Dr., Aptos, CA (US) 95003

( * ) Notice: Subject to any disclaimer, the term of this patent is extended or adjusted under 35 U.S.C. 154(b) by 638 days.

(21) Appl. No.: 11/423,133

(22) Filed: Jun. 8, 2006

Related U.S. Application Data

(60) Provisional application No. 60/753,163, filed on Dec. 22, 2005.

(51) Int. Cl.
 B41J 5/00   (2006.01)
 H03K 17/94  (2006.01)
 H03M 11/00  (2006.01)

(52) U.S. Cl. .................. 400/488; 400/492; 341/20; 341/34

(58) Field of Classification Search .......... 341/20, 341/34, 176; 345/167–169; 400/486, 488–489, 400/492, 82
See application file for complete search history.

(56) References Cited

U.S. PATENT DOCUMENTS

| 4,917,516 | A   |   | 4/1990 | Retter |
|---|---|---|---|---|
| 4,971,465 | A   |   | 11/1990 | Hashimoto |
| 5,137,384 | A   |   | 8/1992 | Spencer et al. |
| 5,660,488 | A   |   | 8/1997 | Miller |
| 5,661,505 | A   | * | 8/1997 | Livits ............... 345/169 |
| 5,743,666 | A   |   | 4/1998 | VanZeeland et al. |
| 6,386,773 | B1  |   | 5/2002 | Mathias |
| 6,860,661 | B1  |   | 3/2005 | Daoud |
| 7,170,427 | B2  | * | 1/2007 | Hsu ................... 341/20 |
| 2005/0089355 | A1 |   | 4/2005 | Benja-Athon |
| 2005/0174331 | A1 |   | 8/2005 | Vayda |
| 2005/0179644 | A1 |   | 8/2005 | Alsio et al. |

OTHER PUBLICATIONS orbiTouch™ Keyless Keyboard, web page, downloaded from http://www.sforh.com/keyboards/orbitouch.html on Aug. 23, 2005, 1 page.

* cited by examiner

*Primary Examiner*—Judy Nguyen
*Assistant Examiner*—Marissa L Ferguson-Samreth
(74) *Attorney, Agent, or Firm*—Patent Law Group LLP; Carmen C. Cook

(57) ABSTRACT

A data entry device includes a pair of key pods adapted for use with left and right hands of a user. Each key pod includes a base housing, a carrier housing mounted on and rotate about the longitudinal pivot of the base housing. The carrier housing has at least a center position, a first rotational position in the clockwise direction, and a second rotational position in the counter-clockwise direction. Each key pod further includes a set of data input keys correspond to the fingers of the user's hand and a thumb key. The set of data input keys provides first, second and third sets of input signals corresponding to the carrier housing being in the center position, the first and the second rotational positions, respectively. The carrier housing may further include overtravel rotational positions in the clockwise and counter-clockwise direction to implement further control or keyboard functions.

24 Claims, 8 Drawing Sheets

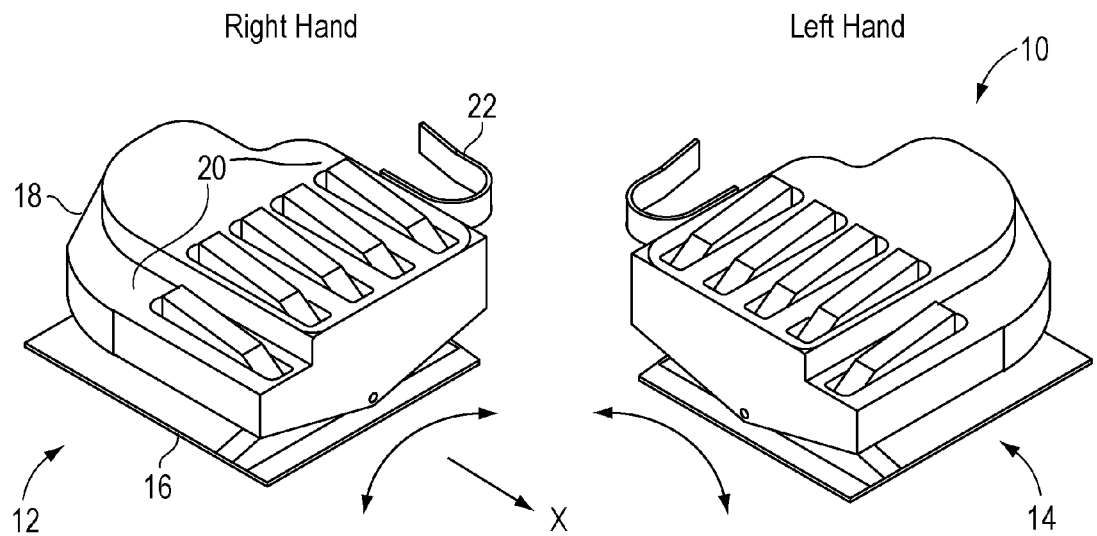
FIG. 1A  FIG. 1B
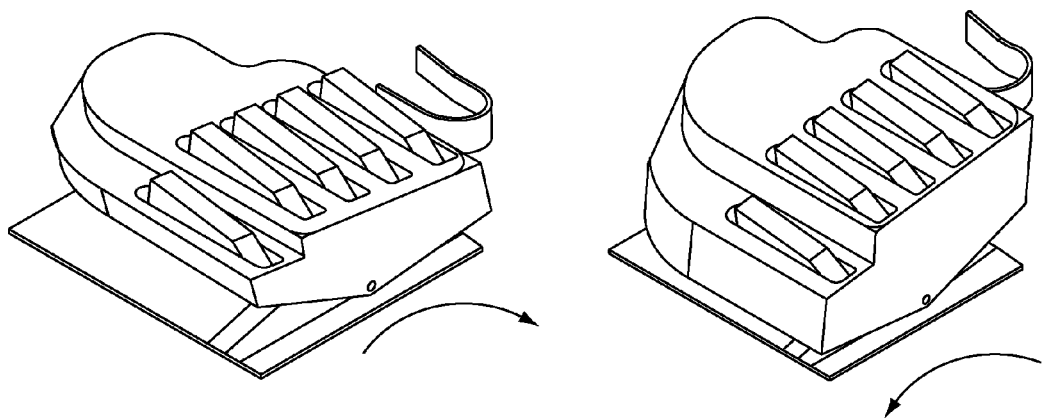
FIG. 1C  FIG. 1D

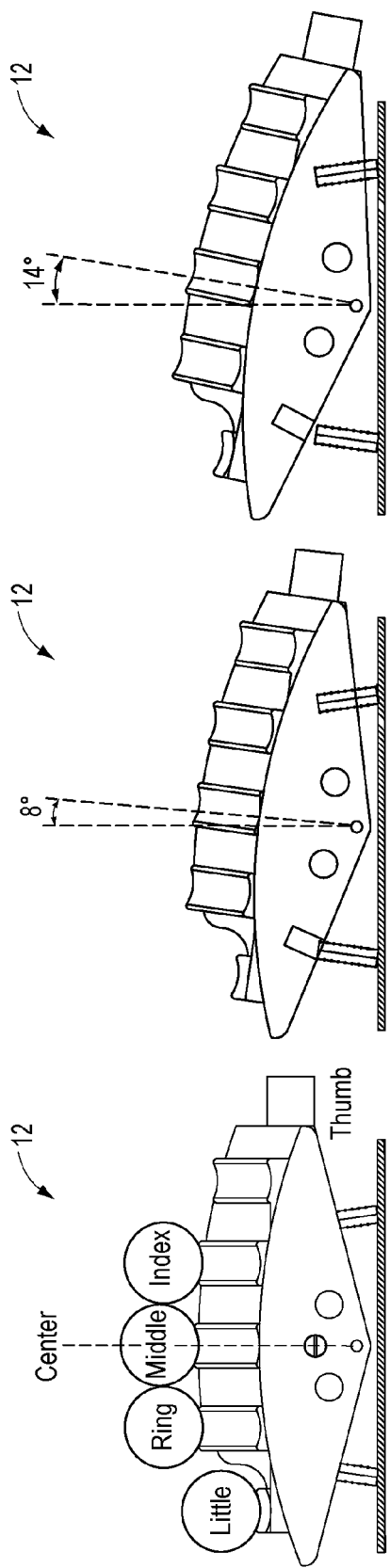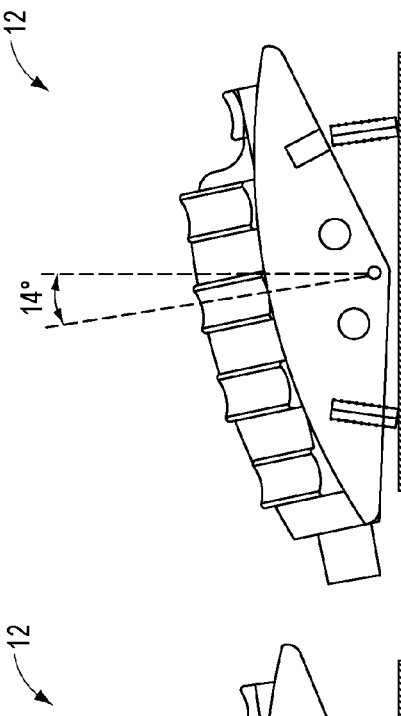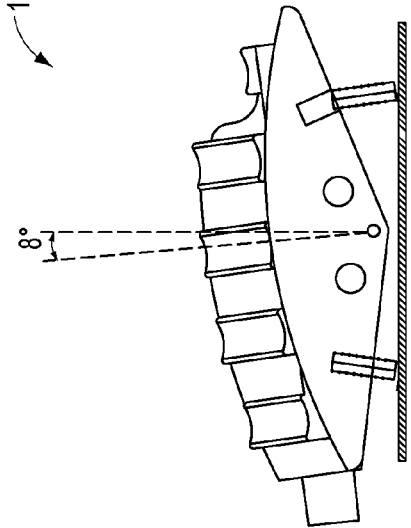

DUAL KEY POD DATA ENTRY DEVICE

CROSS-REFERENCE TO RELATED APPLICATION

This application claims the benefit of U.S. Provisional Patent Application Ser. No. 60/753,163, filed on Dec. 22, 2005, having the same inventorship hereof, which application is incorporated herein by reference in its entirety.

FIELD OF THE INVENTION

The invention relates to a data entry device for computer or other information processing devices and, in particular, to a dual key pod data entry device that is ergonomic and provides improved data entry functionality.

DESCRIPTION OF THE RELATED ART

Keyboards and mouse devices are the predominant data entry devices used for computers or other information processing devices. The combination of the keyboard and mouse enables a wide range of data input and control functions by a user. The most commonly used computer keyboards are modeled after the typewriter keyboard using the QWERTY key arrangement. In the QWERTY key arrangement, the keyboard includes several horizontal rows of keys where the keys are encoded with one or more characters or functions to facilitate the input of text and characters or the control of the computing device. A typical computer keyboard includes keys assigned to letters, numbers and signs (characters) and also keys that produce actions for controlling or operating the computer. Most conventional keyboards today include additional function keys or a numeric keypad to provide additional data input functions.

While the QWERTY type keyboards remain the industry standard for data entry devices, the QWERTY type keyboards have many disadvantages. Most importantly, a QWERTY type keyboard requires finger, hand and wrist movements away from a home position to strike the various keys along the rows of the keyboard. The entire hand may also have to be moved to access the function keys and the numeric keypad. Furthermore, when a mouse device is used, the user often has to move the hand back and forth between the mouse and the keyboard. Thus, the use of the QWERTY type keyboards involves large amounts of finger and/or hand movements. With the increasing and prolonged use of computers in the work place and at home, the large amounts of finger/hand movement often lead to repetitive stress injuries to the wrists, the hands and shoulder of the computer users.

Ergonomic keyboards have been developed in an attempt to reduce the increasing problems of repetitive stress injuries for users of computer keyboards. Many of the conventional solutions are not effective or are cumbersome to use. An ergonomic data entry device providing full keyboard functionality is desired.

SUMMARY OF THE INVENTION

According to one embodiment of the present invention, a data entry device includes a pair of key pods adapted for use with respective left and right hands of a user. Each key pod includes a base housing including a longitudinal pivot along a first axis, a carrier housing mounted on the longitudinal pivot of the base housing where the carrier housing rotates clockwise and counter-clockwise about the first axis. The carrier housing has at least a center position, a first rotational position in the clockwise direction, and a second rotational position in the counter-clockwise direction. The carrier housing includes a top surface and a side surface and having a shape adapted to support the palm of a user's hand with the fingers of the hand extending in the direction of the first axis. Each key pod further includes a set of data input keys disposed on the top surface of the carrier housing and arranged to correspond to the fingers of the user's hand in the hand's natural position, and a thumb key disposed on the side surface of the carrier housing and adapted to receive the thumb of the user's hand in the hand's natural position.

In operation, the set of data input keys provides first, second and third sets of input signals corresponding to the carrier housing being in the center position, the first and the second rotational positions, respectively.

The present invention is better understood upon consideration of the detailed description below and the accompanying drawings.

BRIEF DESCRIPTION OF THE DRAWINGS

FIGS. 1A and 1B are perspective views of a pair of key pods forming a data entry device according to one embodiment of the present invention.

FIGS. 1C and 1D illustrate the right hand key pod of FIG. 1A in a counter-clockwise rotation and a clockwise rotation, respectively, according to one embodiment of the present invention.

FIGS. 3A to 3E are front views of the right hand key pod of FIG. 1A at the center position and the four rotational positions according to one embodiment of the present invention.

DETAILED DESCRIPTION OF THE PREFERRED EMBODIMENTS

Figure 2A:
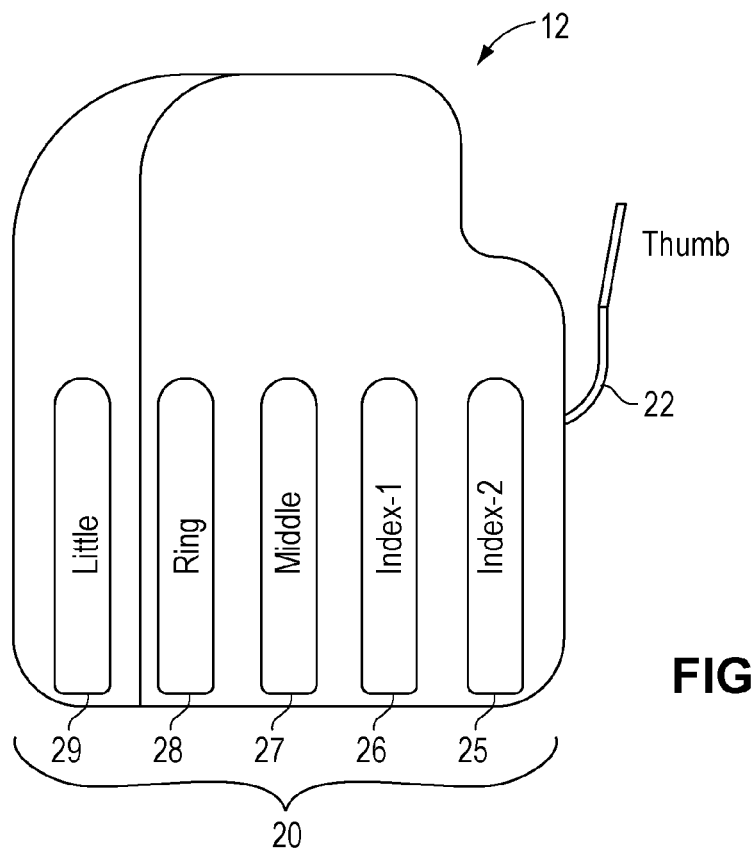
FIG. 2A is a top view of the key pod for the right hand of FIG. 1A according to one embodiment of the present invention.

In accordance with the principles of the present invention, a data entry device includes a pair of key pods adapted for use with the respective right and left hands of a user where each pod includes a carrier housing with a set of data input keys disposed thereon. The carrier housing pivots about a central axis. The combination of the key selection and the pivot angle of the carrier housing determines the character or control function selected by the user. In one embodiment, each key pod includes 5 data input keys to be actuated by the four fingers of the user and a thumb key to be actuated by the thumb of the user. Furthermore, the carrier housing provides two rotational positions in the clockwise direction and two rotational positions in the counter-clockwise direction. As thus configured, the dual-key-pod data entry device of the present invention enables the direct input of all of letters and control functions (cap lock, shift, forward space and backspace) that are implemented in a standard QWERTY keyboard.

Moreover, the dual-key-pod data entry device, utilizing the rotation of the carrier housing to program the functions of the one or more data entry keys, has the capability of providing enhanced text entry functions. That is, the data entry device of the present invention can be programmed to enter an expanded set of text and characters, more than a standard QWERTY keyboard can afford. The enhanced text entry functions provide particular advantage when adapted for use with software applications such as CAD or architectural drawings applications which require a large number of special characters.

The dual-key-pod data entry device of the present invention provides many ergonomic features operative to reduce the stress that may be induced on a user's hands during prolonged use of the device. First, the operation of the dual key pods requires little movement of the user's hands and wrists and allows the user to rest the hands in their natural curved position. By providing two key pods that conform to the natural curvature of the user's hands, the operation of the data entry device of the present invention minimizes the extent of physical movement required for entering information into an associated equipment, such as a computer.

Second, the dual key pods ensure that the hands and arms of the user remain in their natural straight alignment. The dual key pods reduces substantially any side to side bending movement of the wrist, thereby minimizing the potential for wrist related ailments due to extended use of the device.

Third, the dual-key-pod data entry device changes the primary motion of the user's hands and fingers as compared to a standard QWERTY keyboard. Instead of a key striking action which induces stress on the user's fingers and hands, the data entry device merely requires the user to rotate the hands in a natural manner and to push down on a key, such as by use of a squeezing motion. In this manner, the data entry device of the present invention can be instrumental in reducing fatigue and repetitive stress injuries due to prolonged use of the device.

System Overview

FIGS. 1A and 1B are perspective views of a pair of key pods forming a data entry device according to one embodiment of the present invention. FIGS. 1C and 1D illustrate the right hand key pod of FIG. 1A in a counter-clockwise rotation and a clockwise rotation, respectively. Referring to FIGS. 1A to 1D, a data entry device 10 includes a pair of key pods 12, 14 adapted for use with the right and left hands of a user, respectively. The left hand key pod 14 is formed by the mirror image of the right hand key pod 12. Key pods 12, 14 are adapted to support the user's hands in the hand's natural position. In one embodiment, key pods 12 and 14 have a size typical of the conventional handheld point device for computers, such as a computer mouse.

Each of key pods 12, 14 includes a base housing 16 and a carrier housing 18 mounted on a longitudinal pivot of the base housing 16. As thus configured, the carrier housing rotates clockwise and counter-clockwise about a central axis (denoted as x-axis in FIG. 1A) from a center position. The carrier housing of each of key pods 12, 14 thus has one center position and at least one clockwise rotational position (FIG. 1D) and one counter-clockwise rotational position (FIG. 1C).

In the present embodiment, the carrier housing further includes two additional overtravel rotational positions, one for the clockwise direction and one for the counter-clockwise direction. As thus configured, each key pod has a total of five positions about the central axis, as is illustrated in FIGS. 3A to 3E. FIGS. 3A to 3E are front views of the right hand key pod of FIG. 1A at the center position and the four rotational positions according to one embodiment of the present invention. In FIG. 3A, key pod 12 is in its center position. In FIG. 3B, key pod 12 has been rotated counter-clockwise to its first rotational position. In the present illustration, the first counter-clockwise rotational position is 8° from the central axis. In FIG. 3C, key pod 12 has been rotated counter-clockwise to its overtravel rotational position. In the present illustration, the first counter-clockwise rotational position is 14° from the central axis. FIGS. 3D and 3E illustrate the rotation of key pod 12 in the clockwise direction to its second rotational position and to its overtravel rotational position. Each key pod 12, 14 of the data entry device 10 of the present invention thus has five rotational positions, including the center position with no rotation. As will be described in more detail below, the individual rotation of each key pod allows different characters to be selected by the data input keys of the key pod.

Returning to FIGS. 1A and 1B, the carrier housing 18 has a top surface and a side surface and has a shape for supporting the palm of the user's hand in the hand's natural curvature. The carrier housing 18 is configured so that the fingers of the user's hand extend in the direction of the central axis so that when operating the key pod, the hand rotates in a natural manner about the arm of the user.

Figure 2B:
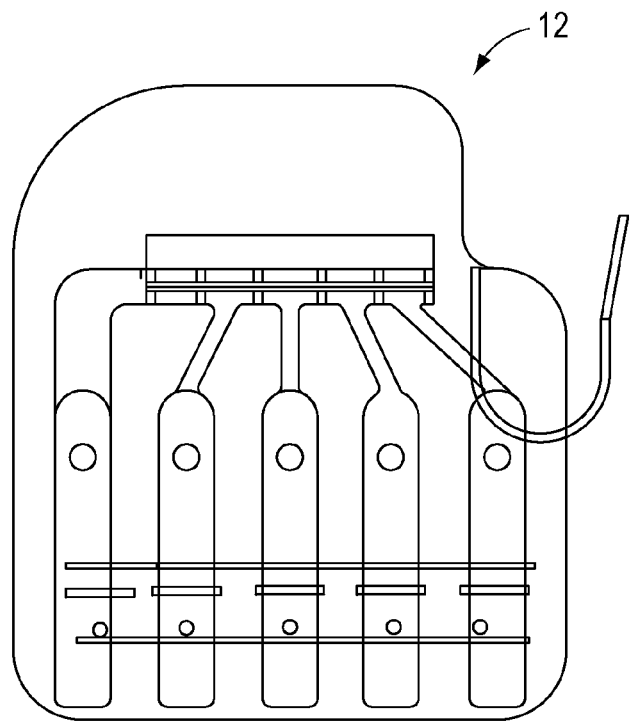
FIG. 2B is a horizontal section view at the PC board and shutter level of the key pod of FIG. 2A according to one embodiment of the present invention.

Each of key pods 12, 14 further includes a set of data input keys 20 and a thumb key 22. FIG. 2A is a top view of the key pod for the right hand of FIG. 1A according to one embodiment of the present invention. FIG. 2B is a horizontal section view at the PC board and shutter level of the key pod of FIG. 2A according to one embodiment of the present invention. Referring to FIG. 2A, the set of data input keys 20 and the thumb key 22 of key pod 12 are positioned to correspond to the fingers and thumb of the user's hand in the hand's natural position. In the present embodiment, the set of data input keys 20 includes five data input keys for the index, middle, ring and little fingers of the user's hand. More specifically, two adjacent data input keys 25 and 26 (Index-1 and Index-2) are to be actuated both by the index finger, a data input key 27 is to be actuated by the middle finger, a data input key 28 is to be actuated by the ring finger and a data input key 29 is to be actuated by the little finger.

In one embodiment, the thumb key can be a switch to be actuated by pressing the thumb key in one direction. The thumb key is thus capable of providing a single control signal. In another embodiment, as shown in FIG. 2B, the thumb key is a dual function pressure key and can be actuated by being pushed inward and by being pull outward. The thumb key is therefore capable of providing at least two control signals when actuated.

In data entry device 10 of the present invention, the data input keys have an elongated configuration, allowing a standard size key pod to be used by a full array of individuals with differing hand sizes. In the operation of the key pods, the fingers will stay in near continuous contact with the data input keys. Therefore, the force required to activate a data input key is greatly reduced when compared with the impact forces required to strike a key in the conventional QWERTY keyboard.

In operation, the set of data input keys of each key pod provides a different set of characters depending on the rotational position of the key pod. The characters can include letters, symbols or numbers. That is, when the carrier housing is at the center position, the data input keys, when actuated, provide a first set of characters. When the carrier housing is at the clockwise rotational position, the data input keys, when actuated, provide a second set of characters. When the carrier housing is at the counter-clockwise rotational position, the data input keys, when actuated, provide a third set of characters. Thus, the set of data input keys on each key pod provides 15 characters for the three carrier housing positions. The two key pods combine to provide up to 30 characters.

Furthermore, the thumb key on each key pod is actuated to implement one or more mode changes functions. When the thumb key is actuated, the set of data input keys provides a fourth set of characters. When the thumb key is a dual function pressure key, the thumb key can be actuated in the inward and outward positions to provide a fourth and a fifth sets of characters. Finally, the carrier housing is rotated to the clockwise overtravel rotational position or the counter-clockwise overtravel rotational position to implement further mode change functions.

When the set of data input keys of each key pod is used in conjunction with the rotation of the carrier housing and the thumb pressure key, the dual-key-pod data entry device can generate a large set of letters, numerals, symbols and control functions. The data entry device of the present invention can be configured to provide the full set of characters and function keys typically provided by most computer keyboards.

Each key pod 12, 14 of the data entry device 10 incorporates an interface circuit to communicate with an associated information processing device, such as a computer. The communication can be through a wired connection by providing a cable at each key pod to be connected to the computer. In a preferred embodiment of the present invention, each key pod 12, 14 communicates with an associated information processing device through a wireless connection. A wireless connection is sometimes desirable to allow the key pod to be placed freely without limitation of the cable.

In one embodiment, the pair of key pods of the data entry device of the present invention are mounted on or fastened to the respective right and left arm rests of the seat of the user. In this manner, the user can assume a natural posture for the upper body when operating the data entry device.

QWERTY Implementation

Figure 4:
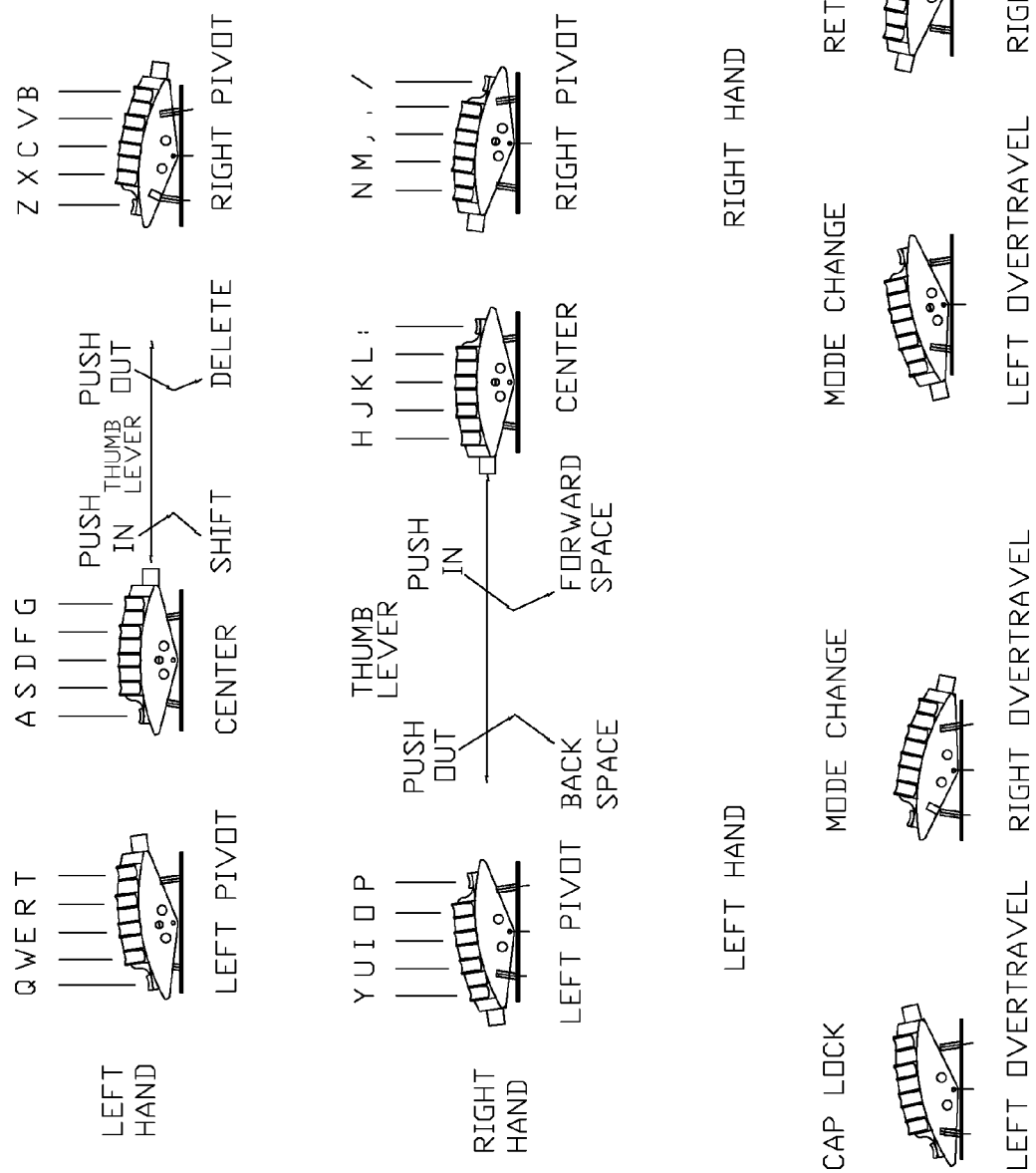
FIG. 4 illustrates the character mapping of the dual-key-pod data entry device of the present invention to implement the QWERTY key arrangement.

In one embodiment, the data entry device of the present invention is configured to implement the QWERTY key arrangement. FIG. 4 illustrates the key assignment for each pod for each rotational position. FIG. 4 illustrates the character mapping of the dual-key-pod data entry device of the present invention to implement the QWERTY key arrangement. Referring to FIG. 4, the character map for each data input key of a right hand key pod and a left hand key pod is shown. In the present illustration, it is assumed that the CAP LOCK function is engaged and therefore, the letters illustrated are the uppercase alphabet.

As shown in FIG. 4, when the left hand and the right hand key pods are in their respective center positions, the data input keys implements the letters in the home row of keys in the standard QWERTY keyboard (letters "ASDFG" and "HJKL;"). Then, when the left and right hand key pods are rotated to their first counter-clockwise position ("LEFT PIVOT"), the data input keys implements the letters in the row of keys above the home row in the standard QWERTY keyboard (letters "QWERT" and "YUIOP"). Finally, when the left and right hand key pods are rotated to their first clockwise position ("RIGHT PIVOT"), the data input keys implements the letters in the row of keys below the home row in the standard QWERTY keyboard (letters "ZXCVB" and "NM,./").

The thumb keys of the left and right key pods provide control functions. For instance, in the present embodiment, the thumb key of the left hand key pod implements the SHIFT function when pushed inward and the DELETE function when pushed outward. Furthermore, the thumb key of the right hand key pod implements the backspace function when pushed inward and the forward space function when pushed outward.

The two overtravel rotational positions for each key pod provide additional programming functions for the data entry device. For instance, when the left hand key pod is rotated to its counter-clockwise overtravel rotational position ("LEFT OVERTRAVEL"), the CAP LOCK function is engaged and when the left hand key pod is rotated to its clockwise overtravel rotational position ("RIGHT OVERTRAVEL"), a first mode change function is engaged. When the right hand key pod is rotated to its counter-clockwise overtravel rotational position ("LEFT OVERTRAVEL"), a second mode change function is engaged and when the right hand key pod is rotated to its clockwise overtravel rotational position ("RIGHT OVERTRAVEL"), the RETURN function is engaged.

The first and second mode change functions can be implemented to provide various sets of characters or symbols for the data input keys. For example, the first mode change can be used to program the data input keys to provide numerical characters from 1 to 0, for example. The second mode change can be used to program the data input keys to implement the "Function Keys (F1, F2 etc.)" function of a standard QWERTY computer keyboard. The mode change functions can be other control functions as well depending on the desired application of the data entry device. For example, the mode change function can be used to implement the TAB functions, alternate punctuations, symbols or special characters for specialized software applications.

It is instructive to note that each key pod can be rotated individually to select different sets of characters. The rotation of the key pods need not be made in synchronous with each other.

When the data entry device of the present invention is configured for the QWERTY key arrangement, the dual key pods can be programmed to implement all the keys and control functions that are provided by the typical QWERTY keyboards. In one embodiment, a graphic user interface can be provided to serve as a visual reference guide to assist a user to learn or adapt to the dual-key-pod data entry device of the present invention. The graphic user interface can be provided as a quick reference to indicate which rotation and finger position are used for a specific key, number or symbol.

The actuation mechanism of the data input keys of the key pods can be implemented using other switching means adaptable to provide an input signal when the key is actuated and to return the key to the neutral position after actuation. In the following description, a mechanical mechanism and an optical mechanism for the data input keys are described. However, the present description is illustrative only and is not intended to be limiting. One of ordinary skill in the art, upon being apprised of the present description, would appreciate that other actuation mechanisms can be used as well to implement the data input keys.

Mechanical Embodiment

Figure 5:
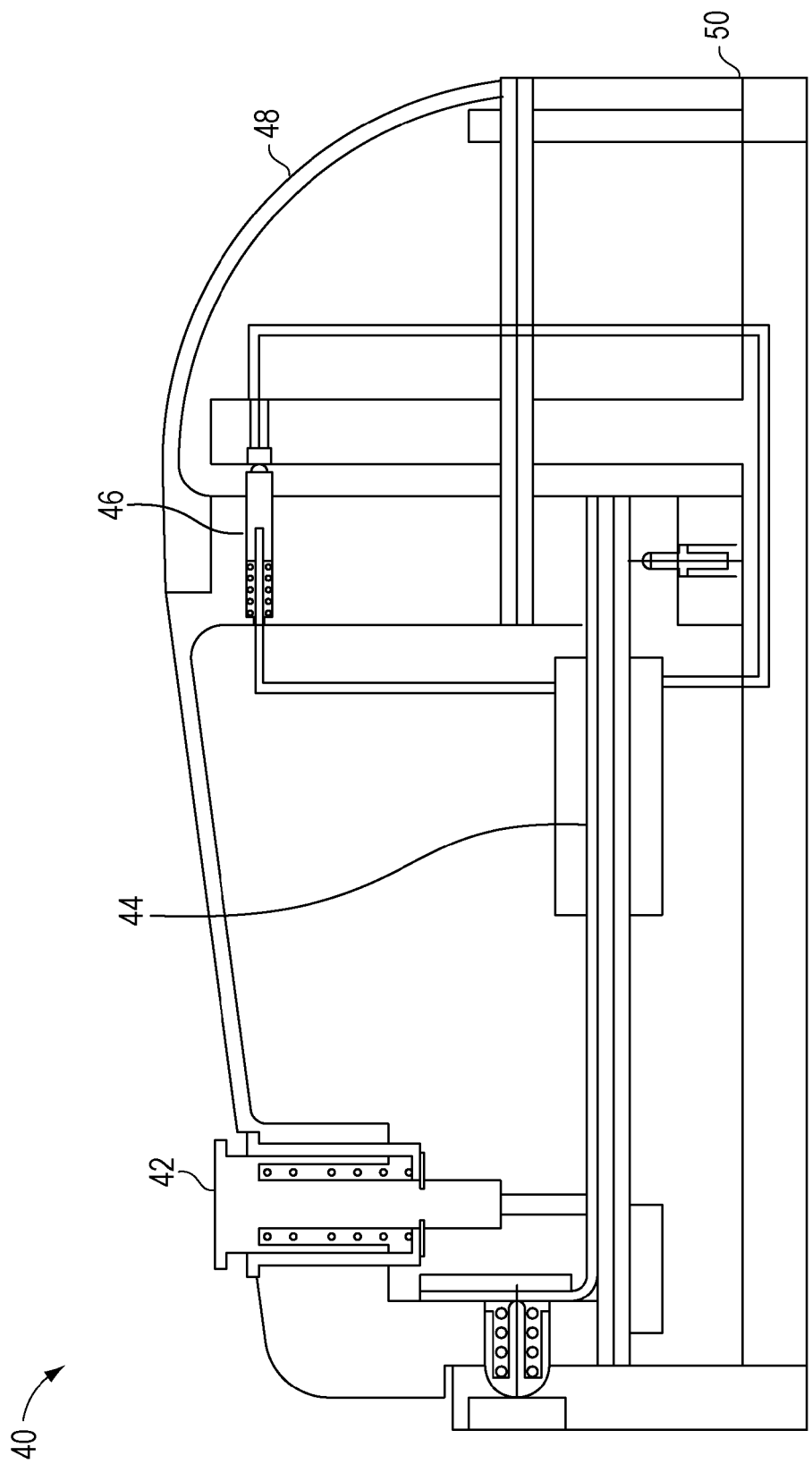
FIG. 5 is a cross-sectional view along the length of a key pod of the data entry device according to one embodiment of the present invention.

FIG. 5 is a cross-sectional view along the length of a key pod of the data entry device according to one embodiment of the present invention. Referring to FIG. 5, a key pod 40 includes a data input key 42 that is implemented as a spring loaded electrical contact. The spring loaded electrical contacts for all the data input keys are directly connected to a flexible printed circuit board 44. The data input key 42 is implemented as a pressure loaded contact which slides against a track and a membrane switch to form the electrical interface with the flexible printed circuit board 44.

More specifically, contact pads are formed on the flexible circuit board 44 and each contact pad is positioned to correspond to a data input key so that when a data input key is depressed, an electrical connection to the corresponding contact pad is made.

The carrier housing 48 is mounted on a longitudinal pivot of the base housing 50. A spring loaded electrical contact 46 including a position spring is provided to balance the carrier housing at the center position. A slight rotary force is required to move the carrier housing 48 either clockwise or counter-clockwise to select the different sets of associated characters for the key pod. Key pod 40 also includes a pair of overtravel spring loaded electrical contacts (not shown) to allow the carrier housing 48 to rotate between the clockwise and the counter-clockwise overtravel positions to select the control functions associated with the overtravel rotational positions.

Printed circuit board 44 houses the integrated circuit that computes the selected characters and control functions based on the input signal from the data input keys and the thumb keys. The integrated circuit may include an interface circuit for connecting to the information processing device. The interface circuit may provide cable or wireless connections.

In one embodiment, the carrier housing includes a detent to allow the center position of the carrier housing to be easily detected.

Optical Embodiment

Figure 6:
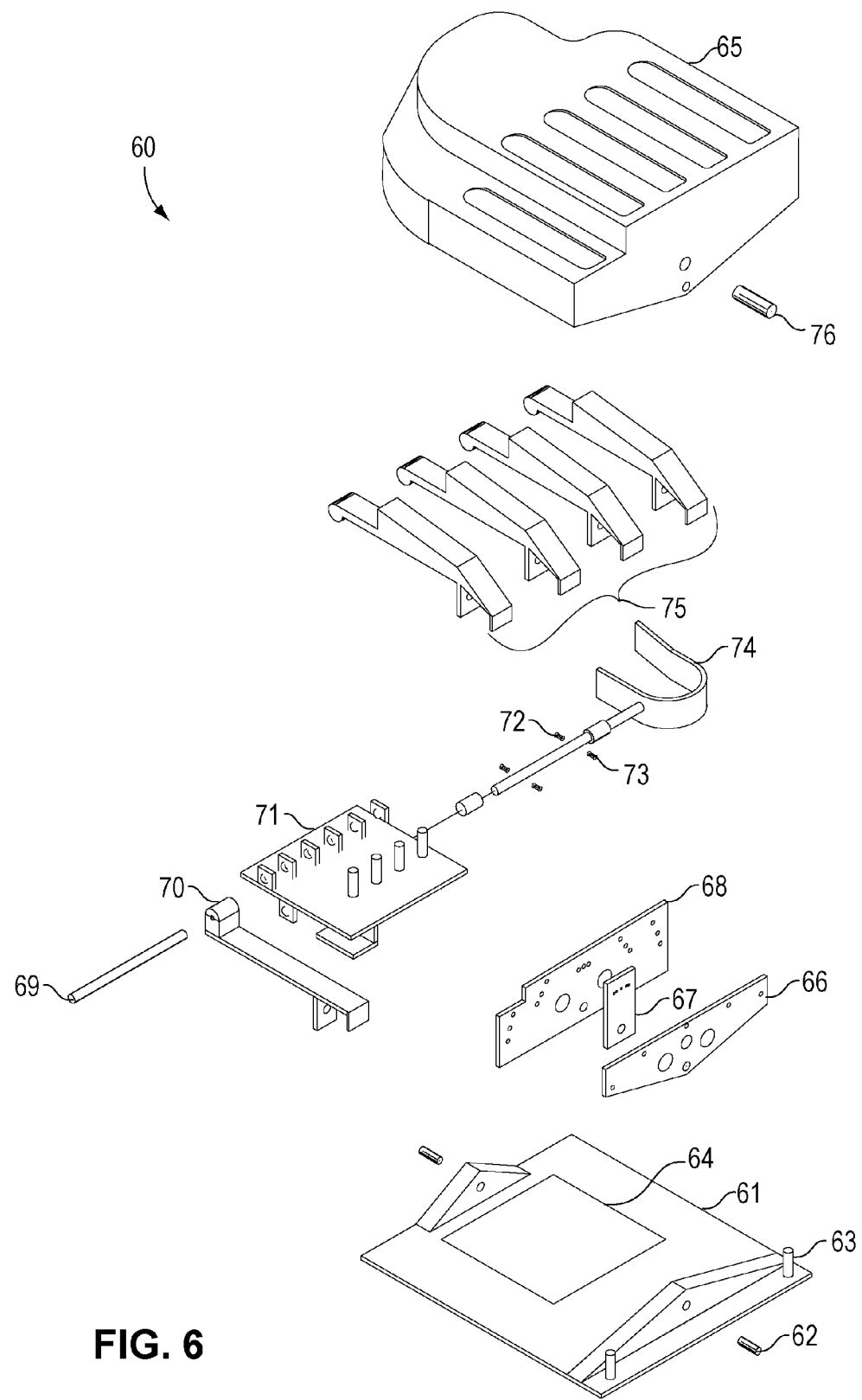
FIG. 6 is an exploded view of a key pod of the data entry device according to an alternate embodiment of the present invention.

According to another embodiment of the present invention, the data input keys of the key pods are implemented using optical switches and solid-state relays as to provide the electrical interface. FIG. 6 is an exploded view of a key pod of the data entry device according to an alternate embodiment of the present invention. FIG. 6 also illustrates internal construction of the key pod that is common to the embodiment of FIG. 5 but not shown in FIG. 5.

Referring to FIG. 6, a key pod 60 includes a base housing 61 on which a printed circuit board 64 is mounted. The base housing 61 includes two pivot bosses 62 defining the central axis about which the carrier housing 65 rotates. A pair of overtravel springs 63 are disposed on the base housing.

Key pod 60 uses optical switches to implement the electrical interface for the data input keys. To that end, a light source board 66, a light receiver board 68, and an overtravel receiver board 67 are provided to realize the optical switching functions. In one embodiment, key pod 60 includes a first optical transmitter and fifteen optical signal receivers to implement the 15 characters that can be realized by the 5 data input keys at three rotational positions (including the center position). The optical signal receivers are electrically connected to the PC board 64 to receive the input signals generated therefrom.

Key pod 60 further includes a second optical transmitter 73 and an optical signal receiver 72 for the thumb key 74.

Key pod 60 includes a pivot mount board 71 for mounting four data input keys 75. The data input key 70 for the little finger is mounted alongside the pivot mount board 71. A data input key pivot shaft 69 couples the little finger key 70 and the data input keys 75 to the pivot mount board 71. The data input keys 70 and 75 operate as optical shutters. When a data input key is actuated, the key operates to allow light from the optical transmitter to pass to the optical receiver, thereby generating an input signal. Otherwise, light from the optical transmitter is blocked from the optical receiver. Key pod 60 also includes return spring and action dampers at each data input key to return the keys to their neutral position. For example, elastomeric bellows can be used to cushion the data input key at the end of the key's travel.

Additional Features

In other embodiments of the present invention, the data entry device of the present invention can be configured to include a pointing device for providing an input signal indicative of the relative motion of the key pod. Furthermore, in other embodiments, the data entry device can be configured to incorporate a scroll wheel for providing a scroll function. In this manner, the dual-key-pod data entry device of the present invention can operate to replace both the keyboard and the pointing device (such as a mouse) when the data entry device is adapted for use with a computer.

Figure 7:
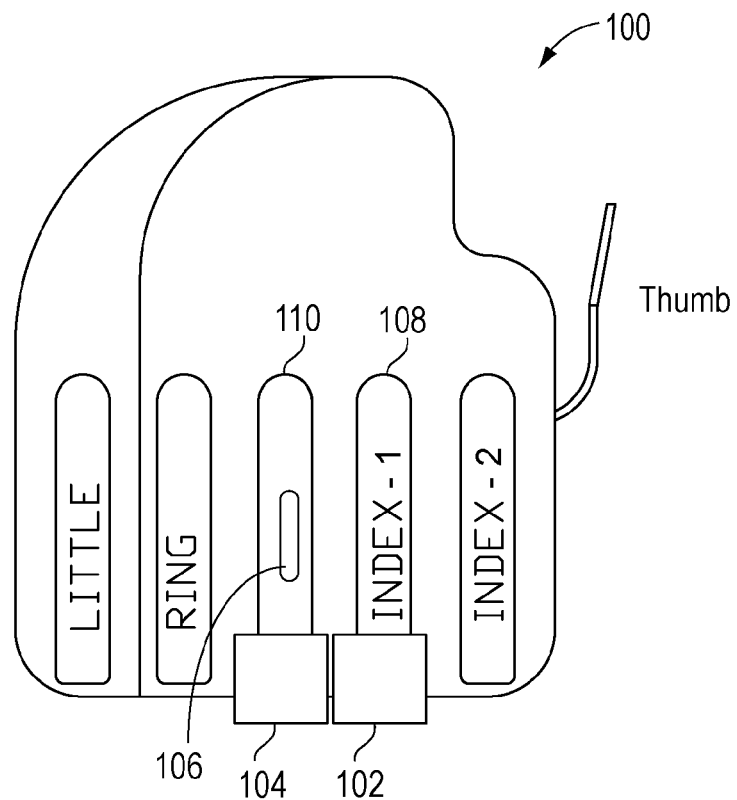
FIG. 7 is a top view of a key pod of a data entry device according to an alternate embodiment of the present invention.
Figure 8:
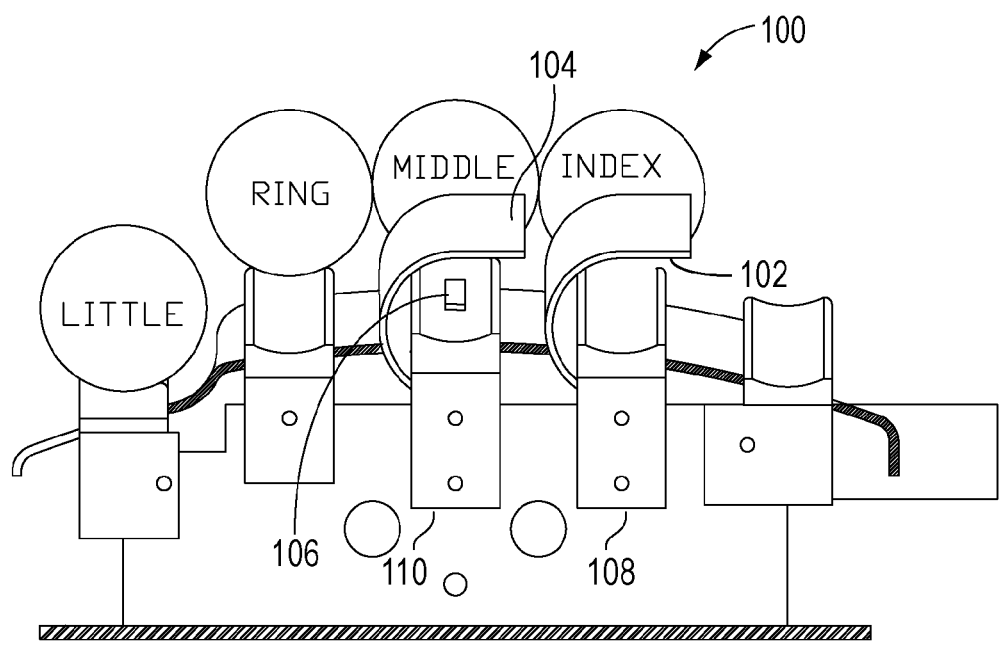
FIG. 8 is an end view of the key pod of FIG. 7.
Figure 9:
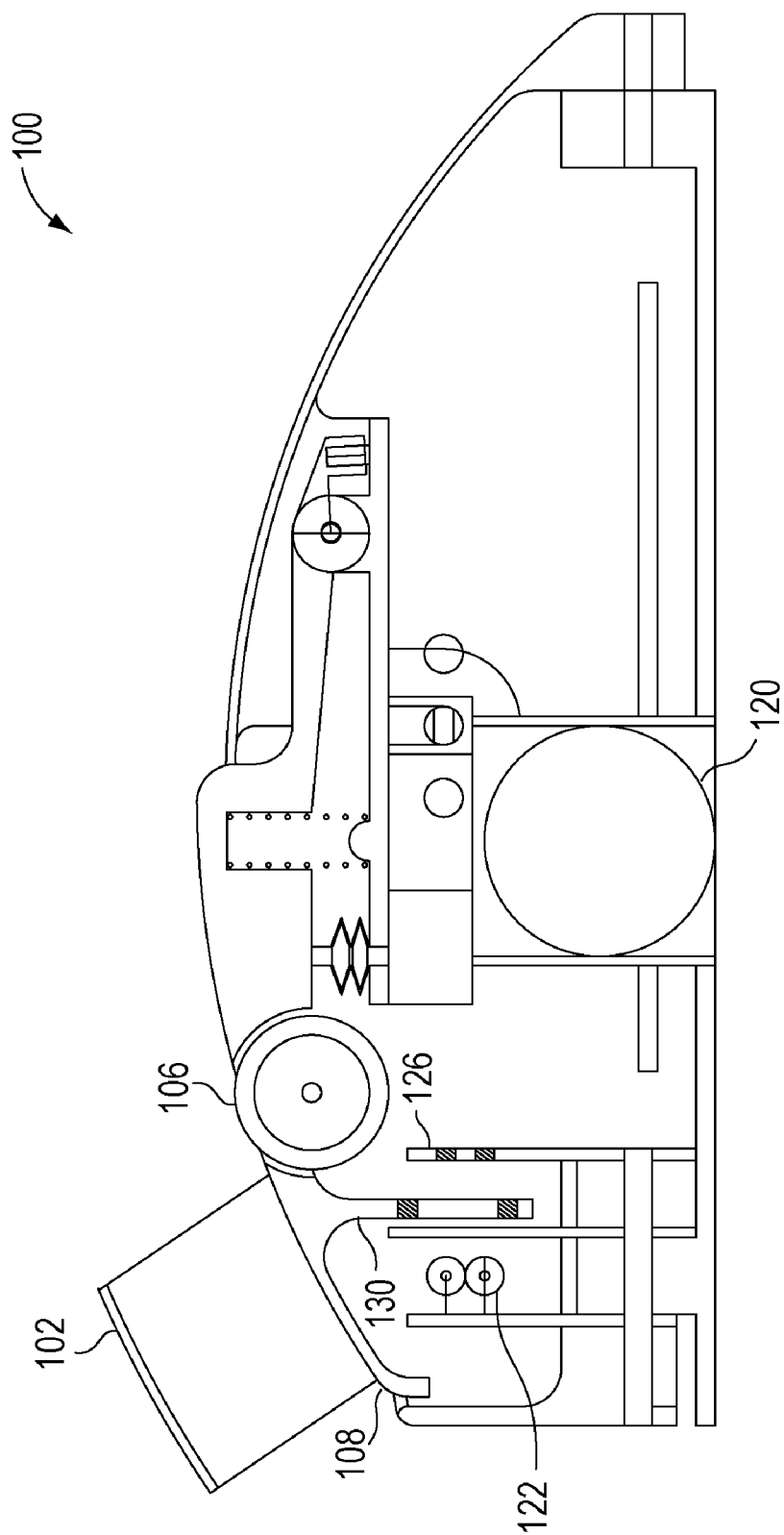
FIG. 9 is a cross-sectional view along the length of the key pod of FIG. 7 according to one embodiment of the present invention.

FIGS. 7-9 illustrate a key pod for the right hand of a data entry device incorporating a pointing device and a scroll wheel according to an alternate embodiment of the present invention. In the present illustration, the pointing device and the scroll wheel are implemented only for the right hand key pod. In other embodiments, the pointing device can be implemented in the left hand key pod to allow a left-handed user to operate the key pod.

In the present embodiment, a key pod 100 incorporates a mechanical mouse device as the pointing device. Furthermore, key pod 100 implements a two-button mouse where two buttons are provided to realize the right-clicking and left-clicking functions. Referring to FIGS. 7 and 8, key pod 100 includes a first finger lever 102 and a second finger lever 104 to implement the right-click and the left-click functions of the optical mouse. The first and second finger levers 102, 104 are actuated by lifting up the finger levers. In the present illustration, the first finger lever 102 is disposed on the first index finger data input key 108 and the second finger lever 104 is disposed on the middle finger data input key 110 so that the index finger and the middle finger of the user is used to actuate the finger levers. In other embodiments, other configurations of the finger levers can be used. Furthermore, when key pod 100 may be configured for a single-button mouse or a multiple-button mouse and the corresponding number of finger lever can be provided on the key pod to implement the mouse clicking functions.

Key pod 100 further includes a scroll wheel 106 disposed on the middle finger data input key 110 (see FIGS. 7-9). Scroll wheel 106 is rotated up or down to provide immediate one-dimensional input signals where the input signals are usually translated into "scrolling" up or down within the currently selected window on the computer or zooming in and out within the currently selected window on the computer. In other embodiments, scroll wheel 106 can be implemented as a tilt-wheel to enable tilting of the wheel for implementing horizontal scrolling.

Referring now to the cross-sectional view of FIG. 9, the finger lever 102 protrudes upward from the data input key 108 to accommodate a finger in the lever cavity. Thus, the data input key 108 is depressed by a downward motion of the finger while the finger lever 102 is lifted by an upward motion of the finger.

FIG. 9 also illustrates in more detail the optical switching mechanism used to implement the data input key 108. A light source 122 is positioned in alignment with a light receiver board 126 so that light from light source 122, when enabled, is transmitted to the light receiver board 126. Data input key 108 includes a plunger portion 130 which acts as a shutter. In the present embodiment, plunger portion 130 includes two light holes to indicate the two positions of the data input key—the data input key being depressed and the data input key being lifted.

When data input key 108 is in its neutral position, plunger portion 130 blocks the light from light source 122 to the light receiver board 126. When data input key 108 is depressed, the top light hole is in alignment with the top light hole of the light receiver board 126 and light is transmitted to the light receiver board 126. When data input key 108 is lifted up, the bottom light hole is in alignment with the bottom light hole of the light receiver board 126 and light is transmitted to the light receiver board 126. In this manner, light receiver board 126 operates to determine the two actuation positions of data input key 108.

The optical switching mechanism for the data input keys illustrated in FIG. 9 is illustrative only. One of ordinary skill in the art would appreciate that other methods for implementing the optical switching mechanism for the data input keys may be used without departing from the spirit of the present invention.

Key pod 100 implements a mechanical mouse in the present embodiment. In FIG. 9, key pod 100 includes a ball 120, capable of being rotated in any direction, to realize the pointing function. In other embodiments, an optical mouse is used where light-emitting diode and photodiodes are used to detect movement of the pointing device. Alternately, the pointing device can be implemented on the top surface of the carrier housing. For example, a track ball may be provided on the top of the carrier housing to implement the pointing functions. In yet another embodiment, the pointing device can be implemented as a TrackPoint pointing device to allow the mouse function to be realized by a mini-joystick style device on the top surface of the key pod. The TrackPoint pointing device can be positioned between a pair of data input keys or embedded in a data input key.

The above detailed descriptions are provided to illustrate specific embodiments of the present invention and are not intended to be limiting. Numerous modifications and variations within the scope of the present invention are possible. The present invention is defined by the appended claims.

We claim:

1. A data entry device, comprising:
a pair of key pods adapted for use with respective left and right hands of a user, each key pod comprising:
a base housing including a longitudinal pivot along a first axis;
a carrier housing mounted on the longitudinal pivot of the base housing, the carrier housing rotating clockwise and counter-clockwise about the first axis, wherein the carrier housing has at least a center position, a first rotational position in the clockwise direction, and a second rotational position in the counter-clockwise direction, the carrier housing comprising a top surface and a side surface and having a shape adapted to support the palm of a user's hand with the fingers of the hand extending in the direction of the first axis;
a plurality of data input keys disposed on the top surface of the carrier housing and arranged to correspond to the fingers of the user's hand in the hand's natural position; and
a thumb key disposed on the side surface of the carrier housing and adapted to receive the thumb of the user's hand in the hand's natural position,
wherein the plurality of data input keys provides first, second and third sets of input signals corresponding to the carrier housing being in the center position, the first and the second rotational positions, respectively.

2. The data entry device of claim 1, wherein the carrier housing further includes a third rotational position in the clockwise direction, and a fourth rotational position in the counter-clockwise direction, the third rotational position having a larger rotational angle than the first rotational position in the clockwise direction and the fourth rotational position has a larger rotational angle than the second rotational position in the counter-clockwise direction.

3. The data entry device of claim 2, wherein the carrier housing is in the third rotational position to generate a first input signal and in the fourth rotational position to generate a second input signal.

4. The data entry device of claim 2, wherein the plurality of data input keys provides a fourth set of input signals corresponding to the carrier housing being in one of the third and fourth rotational positions.

5. The data entry device of claim 4, wherein the plurality of data input keys provides a fifth set of input signals corresponding to the carrier housing being in the other one of the third and fourth rotational positions.

6. The data entry device of claim 4, wherein the first, second, third and fourth sets of input signals comprise text and numerical characters.

7. The data entry device of claim 1, wherein the thumb key is actuated to generate an input signal.

8. The data entry device of claim 1, wherein the thumb key comprises a first inward position when pushed towards the carrier housing and a second outward position when pulled away from the carrier housing, the thumb key providing a first input signal when actuated in the first inward position and a second input signal when actuated in the second outward position.

9. The data entry device of claim 1, wherein the plurality of data input keys comprises a first index finger key, a second index finger key, a middle finger key, a ring finger key and a little finger key, wherein the first index finger key and the second index finger key are to be actuated by the index finger of the user's hand.

10. The data entry device of claim 1, wherein each key pod further comprises:
electrical contact devices disposed within the carrier and base housings for generating electrical signals corresponding to the first, second and third sets of input signals in response to actuation of the plurality of data input keys and the thumb key and the rotational position of the carrier housing.

11. The data entry device of claim 10, wherein the electrical contact devices comprise spring loaded electrical contacts.

12. The data entry device of claim 10, wherein the electrical contact devices comprise optical switches.

13. The data entry device of claim 12, wherein the optical switches comprise at least one optical transmitter and a plurality of optical receivers.

14. The data entry device of claim 10, wherein each key pod further comprises:
   an interface circuit coupled to receive the electrical signals and provide the electrical signals to an external device adapted to receive the electrical signals.

15. The data entry device of claim 14, wherein the interface circuit provides the electrical signals to the external device through a cable.

16. The data entry device of claim 14, wherein the interface circuit comprises a wireless transmitter wherein the interface circuit provides the electrical signals to the external device through a wireless connection.

17. The data entry device of claim 1, wherein each key pod further comprises:
   a pointing device for providing an input signal indicative of the relative motion of the key pod.

18. The data entry device of claim 17, wherein the pointing device comprises an optical mouse device disposed in the base housing.

19. The data entry device of claim 17, wherein the pointing device comprises a pointing device disposed on the top surface of the carrier housing.

20. The data entry device of claim 17, wherein the plurality of data input keys comprises a first index finger key, a second index finger key, a middle finger key, a ring finger key and a little finger key, wherein the first index finger key and the second index finger key are to be actuated by the index finger of the user's hand.

21. The data entry device of claim 20, wherein each key pod further comprises:
   a finger lever coupled to one of the plurality of data input keys, the finger lever being actuated to implement a clicking function of the pointing device.

22. The data entry device of claim 20, wherein each key pod further comprises:
   a first finger lever coupled to the second index finger key and a second finger lever coupled to the middle finger key, the first finger lever and the second finger lever being actuated to implement the right click and the left click functions of the pointing device.

23. The data entry device of claim 1, wherein each key pod further comprises:
   a scroll wheel device integrated in one of the plurality of data input keys for providing an input signal indicative of rotation motions of the scroll wheel device.

24. The data entry device of claim 1, wherein each key pod further comprises:
   a fastener for affixing the key pod to an arm rest of a chair.

\* \* \* \* \*